(12) United States Patent
Kim et al.

(10) Patent No.: US 11,776,610 B2
(45) Date of Patent: *Oct. 3, 2023

(54) POWER GATING CONTROL CIRCUIT AND SEMICONDUCTOR APPARATUS INCLUDING THE POWER GATING CONTROL CIRCUIT

(71) Applicant: SK hynix Inc., Icheon-si (KR)

(72) Inventors: Woong Rae Kim, Icheon-si (KR); Sung Je Roh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/708,721

(22) Filed: Mar. 30, 2022

(65) Prior Publication Data

US 2022/0223200 A1 Jul. 14, 2022

Related U.S. Application Data

(63) Continuation of application No. 17/020,206, filed on Sep. 14, 2020, now Pat. No. 11,322,193.

(30) Foreign Application Priority Data

Jun. 26, 2020 (KR) .......................... 10-2020-0078400

(51) Int. Cl.
*G11C 11/406* (2006.01)
*G11C 11/4074* (2006.01)
(Continued)

(52) U.S. Cl.
CPC ........ *G11C 11/40615* (2013.01); *G11C 7/065* (2013.01); *G11C 7/222* (2013.01);
(Continued)

(58) Field of Classification Search
CPC ..... G11C 7/065; G11C 7/222; G11C 11/4074; G11C 11/4087; H03K 3/012; H03K 3/037
(Continued)

(56) References Cited

U.S. PATENT DOCUMENTS 5,576,641 A  11/1996  Yoneya et al.
6,876,252 B2  4/2005  Kim et al.
(Continued)

*Primary Examiner* — Ly D Pham
(74) *Attorney, Agent, or Firm* — WILLIAM PARK & ASSOCIATES LTD.

(57) ABSTRACT

A power gating control circuit includes an operational period signal generating circuit, a period termination detecting circuit, a power gating period signal generating circuit and a power gating control signal generating circuit. The operational period signal generating circuit generates a plurality of operational period signals based on internal clock signals and one or more of command shift signals. The period termination detecting circuit generates a write period termination signal and a read period termination signal based on the command signals and the plurality of operational period signals. The power gating period signal generating circuit generates a first power gating period signal and a second power gating period signal based on the write period termination signal, the read period termination signal and remaining command shift signals other than the one or more command shift signals. The power gating control signal generating circuit generates a plurality of power gating control signals based on the first power gating period signal, the second power gating period signal, and other signals to control entry into and exit from a power-down mode of a semiconductor apparatus.

9 Claims, 12 Drawing Sheets

(51) Int. Cl.
 G11C 11/408 (2006.01)
 G11C 7/06 (2006.01)
 G11C 7/22 (2006.01)
 H03K 3/012 (2006.01)
 H03K 3/037 (2006.01)

(52) U.S. Cl.
 CPC ...... G11C 11/4074 (2013.01); G11C 11/4087 (2013.01); H03K 3/012 (2013.01); H03K 3/037 (2013.01)

(58) Field of Classification Search
 USPC .......................................................... 365/222
 See application file for complete search history.

(56) References Cited

U.S. PATENT DOCUMENTS

| | | | |
|---|---|---|---|
| 7,826,304 B2 * | 11/2010 | Jang | G11C 5/144 365/233.15 |
| RE44,025 E * | 2/2013 | Eisenstadt | H03K 19/0016 716/126 |
| 8,736,314 B2 | 5/2014 | Kim | |
| 10,608,615 B2 | 3/2020 | Kim et al. | |
| 10,943,626 B1 * | 3/2021 | Kim | G11C 7/106 |
| 11,100,962 B2 * | 8/2021 | Lee | G11C 5/147 |
| 11,322,193 B2 * | 5/2022 | Kim | G11C 11/4076 |
| 2002/0191472 A1 | 12/2002 | Okamoto et al. | |
| 2009/0257290 A1 * | 10/2009 | Kim | G11C 19/28 365/189.12 |
| 2010/0148820 A1 * | 6/2010 | Nishioka | H03K 19/17784 326/39 |
| 2011/0063895 A1 * | 3/2011 | Komatsu | G11C 11/413 365/156 |
| 2015/0091633 A1 * | 4/2015 | Tsuchiya | G06F 30/392 716/120 |
| 2015/0194208 A1 | 7/2015 | Nagle et al. | |
| 2017/0168757 A1 * | 6/2017 | Nakajima | G06F 3/0685 |
| 2018/0188762 A1 * | 7/2018 | Wang | G05F 1/46 |
| 2018/0322938 A1 | 11/2018 | Kim et al. | |
| 2018/0337676 A1 | 11/2018 | Kim et al. | |
| 2019/0123741 A1 | 4/2019 | Okamoto et al. | |
| 2019/0278359 A1 | 9/2019 | Kim et al. | |
| 2020/0142473 A1 | 5/2020 | Kim | |
| 2020/0357445 A1 * | 11/2020 | Lee | G11C 5/147 |
| 2021/0174847 A1 * | 6/2021 | Kim | G11C 7/1048 |

* cited by examiner

POWER GATING CONTROL CIRCUIT AND SEMICONDUCTOR APPARATUS INCLUDING THE POWER GATING CONTROL CIRCUIT

CROSS-REFERENCES TO RELATED APPLICATION

The present application is a continuation application of U.S. patent application Ser. No. 17/020,206, filed on Sep. 14, 2020, and claims priority under 35 U.S.C. § 119(a) to Korean application number 10-2020-0078400, filed on Jun. 26, 2020, in the Korean Intellectual Property Office, which is incorporated herein by reference in its entirety as set forth in full.

BACKGROUND

1. Technical Field

Various embodiments are related to a semiconductor circuit, and more particularly, to a power gating control circuit and semiconductor apparatus including the power gating control circuit.

2. Related Art

A semiconductor apparatus may operate based on various operation modes (e.g., read mode, write mode, active mode, standby mode and so forth).

Since an electronic device with the semiconductor apparatus, especially a portable electronic device, operates based on limited power, i.e., a battery, unnecessary power consumption should be reduced.

Therefore, a power gating technology that can optimize an operation performance and power consumption of the semiconductor apparatus is required.

SUMMARY

In an embodiment, a power gating control circuit may include an operational period signal generating circuit, a period termination detecting circuit, a power gating period signal generating circuit and a power gating control signal generating circuit. The operational period signal generating circuit may generate a plurality of operational period signals based on internal clock signals and one or more of command shift signals. The period termination detecting circuit may generate a write period termination signal and a read period termination signal based on the command signals and the plurality of operational period signals. The power gating period signal generating circuit may generate a first power gating period signal and a second power gating period signal based on the write period termination signal, the read period termination signal and remaining command shift signals other than the one or more of command shift signals. The power gating control signal generating circuit may generate a plurality of power gating control signals based on the first power gating period signal, the second power gating period signal, and other signals to control entry into and exit from a power-down mode of a semiconductor apparatus.

In an embodiment, a semiconductor apparatus may include a plurality of circuit groups and a power gating control circuit. The power gating control circuit may generate a plurality of power gating control signals to selectively control a power supply to the plurality of circuit groups and to cut off the power supply based on operational modes of the semiconductor apparatus with a write operation and a read operation.

DETAILED DESCRIPTION

Various examples and implementations of the disclosed technology are described below with reference to the accompanying drawings.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
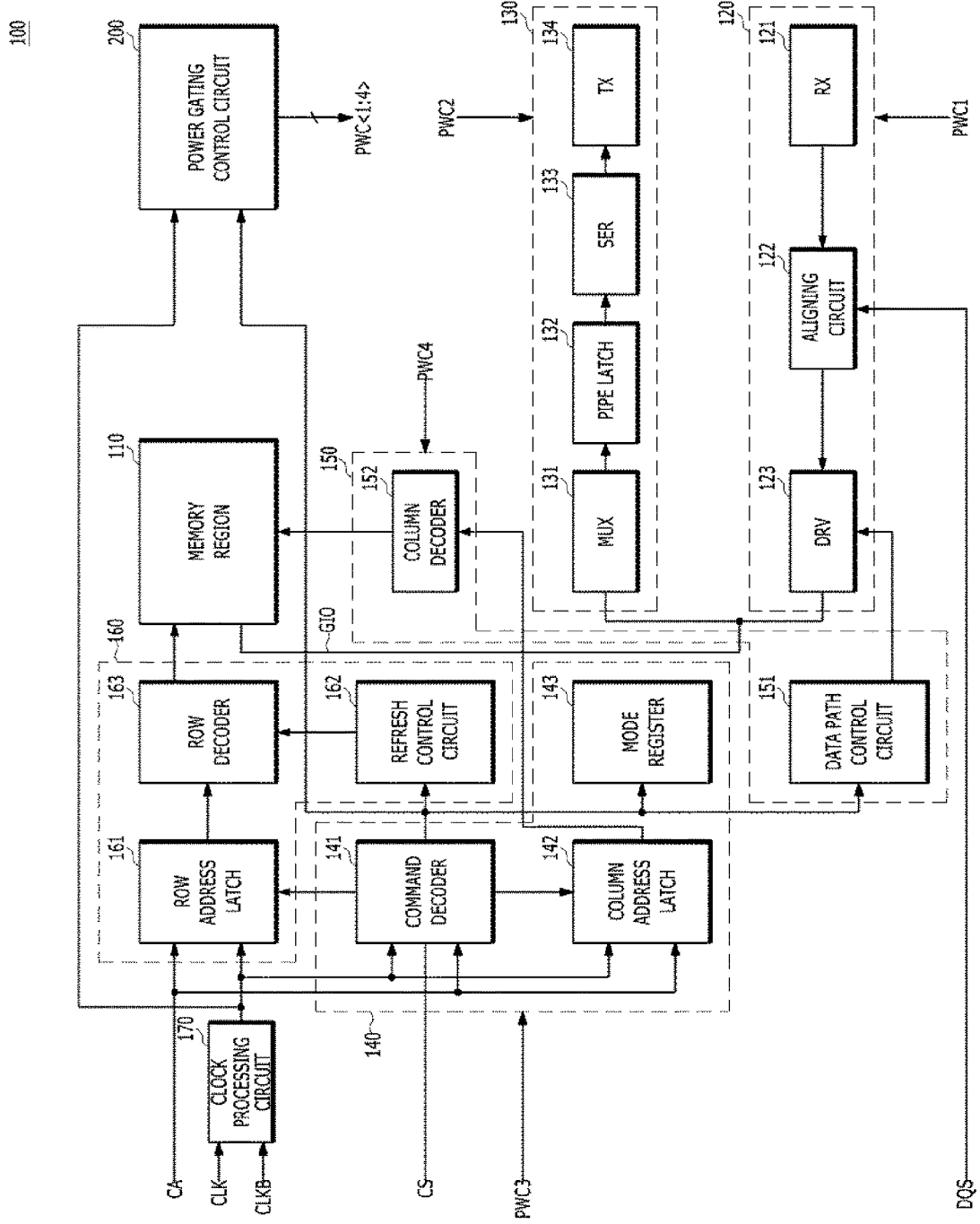
FIG. 1 is a diagram, illustrating a configuration of a semiconductor apparatus in accordance with an embodiment.

In accordance with an embodiment of the disclosure, provided are a power gating control circuit and a semiconductor apparatus, including the power gating control circuit, FIG. 1 is a diagram, illustrating a configuration of a semiconductor apparatus 100 in accordance with an embodiment.

Referring to FIG. 1, the semiconductor apparatus 100 may include a memory region 110, a first circuit group 120, a second circuit group 130, a third circuit group 140, a fourth circuit group 150, a fifth circuit group 160, a clock processing circuit 170, and a power gating control circuit 200.

The clock processing circuit 170 may receive differential clock signals CLK and CLKB to generate internal clock signals, the differential clock signals CLK and CLKB being provided from an external device.

The clock processing circuit 170 may generate the internal clock signals with different phases or frequencies by inverting or dividing the differential clock signals CLK and CLKB.

The clock processing circuit 170 may generate the internal clocks signals ICLK<A:B>, ICLKS<A:B>, and ICLKR<A:B>, which will be described with reference to FIG. 3 and following drawings.

The first circuit group 120 may include circuit elements that relate to a data write operation of the semiconductor apparatus 100, i.e., circuit elements that are required to be activated during the data write operation.

Power supply to the circuit elements within the first circuit group 120 and cut off the power supply to the circuit elements within the first circuit group 120 may be controlled through a first power gating control signal PWC1.

The first power gating control signal PWC1 may have a first level during a power-down period and operational periods other than a data write operational period of the semiconductor apparatus 100. The first power gating control signal PWC1 may have a second level during the data write operational period.

When the first power gating control signal PWC1 has the first level, the power supply to the circuit elements within the first circuit group 120 may be interrupted.

When the first power gating control signal PWC1 has the second level, the power may be supplied to the circuit elements within the first circuit group 120.

The first circuit group 120 may include a receiver (RX) 121, an aligning circuit 122 and a driver (DRV) 123.

The receiver 121 may receive data that is provided from an external through pads, for example, data input/output pads (DQ pads: not illustrated).

The aligning circuit 122 may align the data that is received through the receiver 121 for the data, which is serial, to become parallel.

The driver 123 may drive a global data line GIO to transfer the output from the aligning circuit 122 to the memory region 110.

The second circuit group 130 may include circuit elements that relate to a data read operation of the semiconductor apparatus 100, i.e., circuit elements that are required to be activated during the data read operation.

Power supply to the circuit elements within the second circuit group 130 and the cut off the power supply to the circuit elements within the second circuit group 130 may be controlled through a second power gating control signal PWC2.

The second power gating control signal PWC2 may have a first level during the power-down period and operational periods other than a data read operational period of the semiconductor apparatus 100. The second power gating control signal PWC2 may have a second level during the data read operational period.

When the second power gating control signal PWC2 has the first level, the power supply to the circuit elements within the second circuit group 130 may be interrupted.

When the second power gating control signal PWC2 has the second level, the power may be supplied to the circuit elements within the second circuit group 130.

The second circuit group 130 may include a multiplexer (MUX) 131, a pipe latch 132, a serializer (SER) 133 and a transmitter (TX) 134.

The multiplexer 131 may multiplex data output from the memory region 110 and may output the multiplexed data.

The pipe latch 132 may latch in parallel the output from the multiplexer 131 and may output the latched data.

The serializer 133 may serialize the output from the pipe latch 132 for the parallel data to become serial and may output the serial data.

The transmitter 134 may transmit the output from the serializer 133 to the external device through pads, for example, data input/output pads (DQ pads: not illustrated).

The third circuit group 140 may include circuit elements that relate to process on a command and an address of the semiconductor apparatus 100, i.e., circuit elements that are required to be activated during the process on a command and an address.

Power supply to the circuit elements within the third circuit group 140 and the cut off the power supply to the circuit elements within the third circuit group 140 may be controlled through a third power gating control signal PWC3.

The third power gating control signal PWC3 may have a first level during the power-down period. The third power gating control signal PWC3 may have a second level during operational periods other than the power-down period.

When the third power gating control signal PWC3 has the first level, the power supply to the circuit elements within the third circuit group 140 may be interrupted.

When the third power gating control signal PWC3 has the second level, the power may be supplied to the circuit elements within the third circuit group 140.

The third circuit group 140 may include a command decoder 141, a column address latch 142, and a mode register 143.

The command decoder 141 may generate command signals by decoding a command that is defined by a command/address signal CA and a chip selection signal CS based on the internal clock signals that are generated by the clock processing circuit 170.

The command decoder 141 may generate the command signals EWT1<A:B>, ERT1<A:B>, PDX, and PDE, which will be described with reference to FIG. 3 and following drawings.

The column address latch 142 may latch a column address that is included in the command/address signal CA based on the internal clock signals that are generated by the clock processing circuit 170.

The mode register 143 may store, therein, information that relates to an operation of the semiconductor apparatus 100.

The mode register 143 may store therein the information that relates to an operation of the semiconductor apparatus 100 based on the command signals that are generated by the command decoder 141.

The fourth circuit group 150 may include circuit elements that relate to both the data write operation and the data read operation of the semiconductor apparatus 100, i.e., circuit elements that are required to be activated during both the data write operation and the data read operation.

Power supply to the circuit elements within the fourth circuit group 150 and cut off the power supply to the circuit elements within the fourth circuit group 150 may be controlled through a fourth power gating control signal PWC4.

The fourth power gating control signal PWC4 may have a first level during the power-down period and operational periods other than both the data write operational period and the data read operational period of the semiconductor apparatus 100. The fourth power gating control signal PWC4 may have a second level during both the data write operational period and the data read operational period.

When the fourth power gating control signal PWC4 has the first level, the power supply to the circuit elements within the fourth circuit group 150 may be interrupted.

When the fourth power gating control signal PWC4 has the second level, the power may be supplied to the circuit elements within the fourth circuit group 150.

The fourth circuit group 150 may include a data path control circuit 151 and a column decoder 152.

The data path control circuit 151 may control, based on a control signal, a path of the data that is transferred from the first circuit group 120 through the global data lire GIO.

The column decoder 152 may access a column within the memory region 110 by decoding the column address that is latched by the column address latch 142 within the third circuit group 140.

The fifth circuit group 160 may include circuit elements that relate to a row access operation and a refresh operation of the semiconductor apparatus 100, i.e., circuit elements that are required to be activated during the row access operation and the refresh operation.

The circuit elements within the fifth circuit group 160 should be activated during the row access operation and the refresh operation.

Since the refresh operation should be performed even during the power-down period of the semiconductor apparatus 100, the power may be supplied to the circuit elements within the fifth circuit group 160 without a specific control.

The fifth circuit group 160 may include a row address latch 161, a refresh control circuit 162, and a row decoder 163.

The row address latch 161 may latch a row address included in the command/address signal CA based on the internal clock signals that are generated by the clock processing circuit 170.

The refresh control circuit 162 may generate and output a refresh address for the refresh operation based on the command signals that are generated by the command decoder 141.

The row decoder 163 may access a row within the memory region 110 by decoding the row address latched by the row address latch 161.

The row decoder 163 may access a row within the memory region 110 by decoding the refresh address output from the refresh control circuit 162.

The power gating control circuit 200 may generate the first to fourth power gating control signals PWC1 to PWC4 to selectively control the power supply to the first to fifth circuit groups 120 to 160 and to cut off the power supply based on the operational modes of the semiconductor apparatus 100, including the data write operation and the data read operation.

The power gating control circuit 200 may generate the first to fourth power gating control signals PWC1 to PWC4 based on the internal clock signals that are generated by the clock processing circuit 170 and the command signals that are generated by the command decoder 141.

Figure 2A:
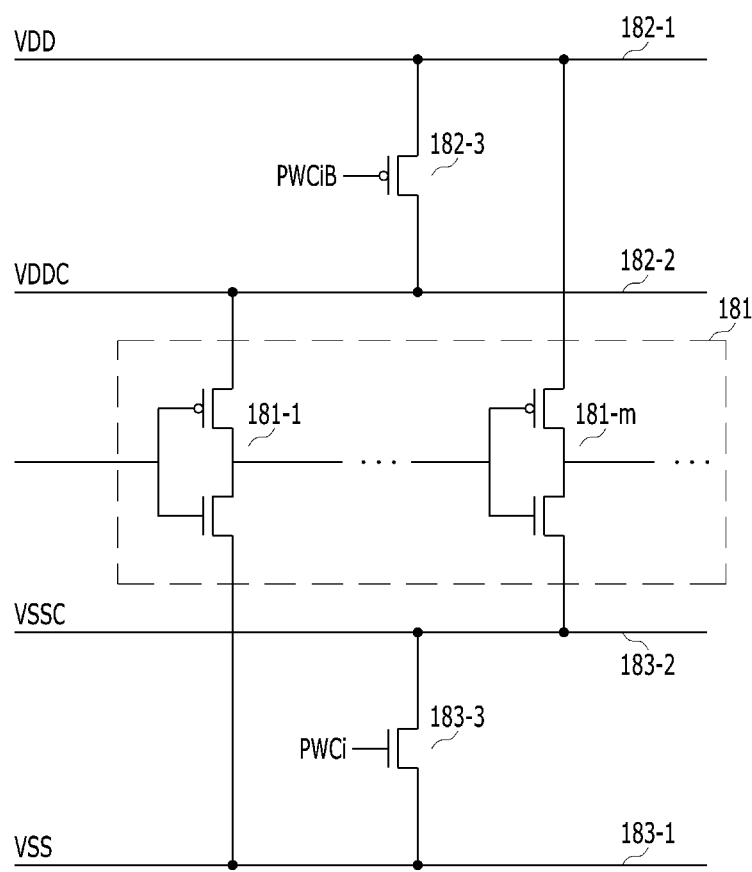
FIGS. 2A and 2B are configuration examples of a power gating of a semiconductor apparatus in accordance with an embodiment.
Figure 2B:
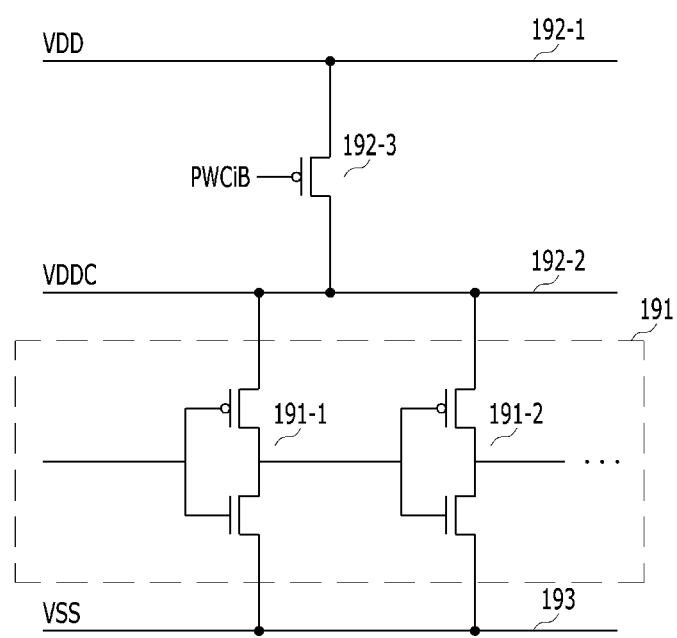

FIGS. 2A and 2B are configuration examples of a power gating of the semiconductor apparatus 100 in accordance with an embodiment.

Power gating is designed within semiconductor apparatuses, including the semiconductor apparatus 100, for power saving.

Based on the power gating, power gating switches may be provided between a power line and logic circuit regions. The power gating switches may be controlled through a corresponding one among the first to fourth power gating control signals PWC1 to PWC4.

FIG. 2A illustrates an example of the power gating based on a "zigzag" scheme applied to one among the first to fourth circuit groups 120 to 150.

Referring to FIG. 2A, each of the first to fourth circuit groups 120 to 150 may include a logic circuit region 181, a first power line 182-1, a second power line 182-2, a first switch 182-3, a first ground line 183-1, a second ground line 183-2 and a second switch 183-3.

A first power voltage VDD may be applied to the first power line 182-1.

The first switch 182-3 may provide, as a second power voltage VDDC, the first power voltage VDD to the second power line 182-2 based on an inverted signal PWCiB of a PWCi among the first to fourth power gating control signals PWC1 to PWC4.

A first ground voltage VSS may be applied to the first ground line 183-1.

The second switch 183-3 may provide, as a second ground voltage VSSC, the first ground voltage VSS to the second ground line 183-2 based on a PWCi among the first to fourth power gating control signals PWC1 to PWC4.

The logic circuit region 181 may include a plurality of logic gates 181-1 to 181-$n$.

Any one (e.g., the logic gate 181-1) of the plurality of logic gates 181-1 to 181-$n$ may be coupled to the second power line 182-2 and the first ground line 183-1.

Another one (e.g., the logic gate 181-$m$) of the plurality of logic gates 181-1 to 181-$n$ may be coupled to the first power line 182-1 and the second ground line 183-2.

For example, when FIG. 2A is referring to the first circuit group 120, the first switch 182-3 may be controlled through an inverted signal PWC1B of the first power gating control signal PWC1, and the second switch 183-3 may be controlled through the first power gating control signal PWC1.

FIG. 2B illustrates an example of the power gating based on a "header only" scheme that is applied to one among the first to fourth circuit groups 120 to 150.

Referring to FIG. 2B, each of the first to fourth circuit groups 120 to 150 may include a logic circuit region 191, a first power line 192-1, a second power line 192-2, a switch 192-3, and a first ground line 193.

A first power voltage VDD may be applied to the first power line 192-1.

The switch 192-3 may provide, as a second power voltage VDDC, the first power voltage VDD to the second power line 192-2 based on an inverted signal PWCiB of a PWCi among the first to fourth power gating control signals PWC1 to PWC4.

A first ground voltage VSS may be applied to the first ground line 193-1.

The logic circuit region 191 may include a plurality of logic gates 191-1 to 191-$n$.

The plurality of logic gates 191-1 to 191-$n$ may be coupled to the second power line 192-2 and the first ground line 193.

For example, when FIG. 2B is referring to the fourth circuit group 150, the switch 192-3 may be controlled through an inverted signal PWC4B of the fourth power gating control signal PWC4.

One or more between the power gating based on the "zigzag" scheme and the power gating based on the "header only" scheme may be applied to the first to fourth circuit groups 120 to 150.

Figure 3:
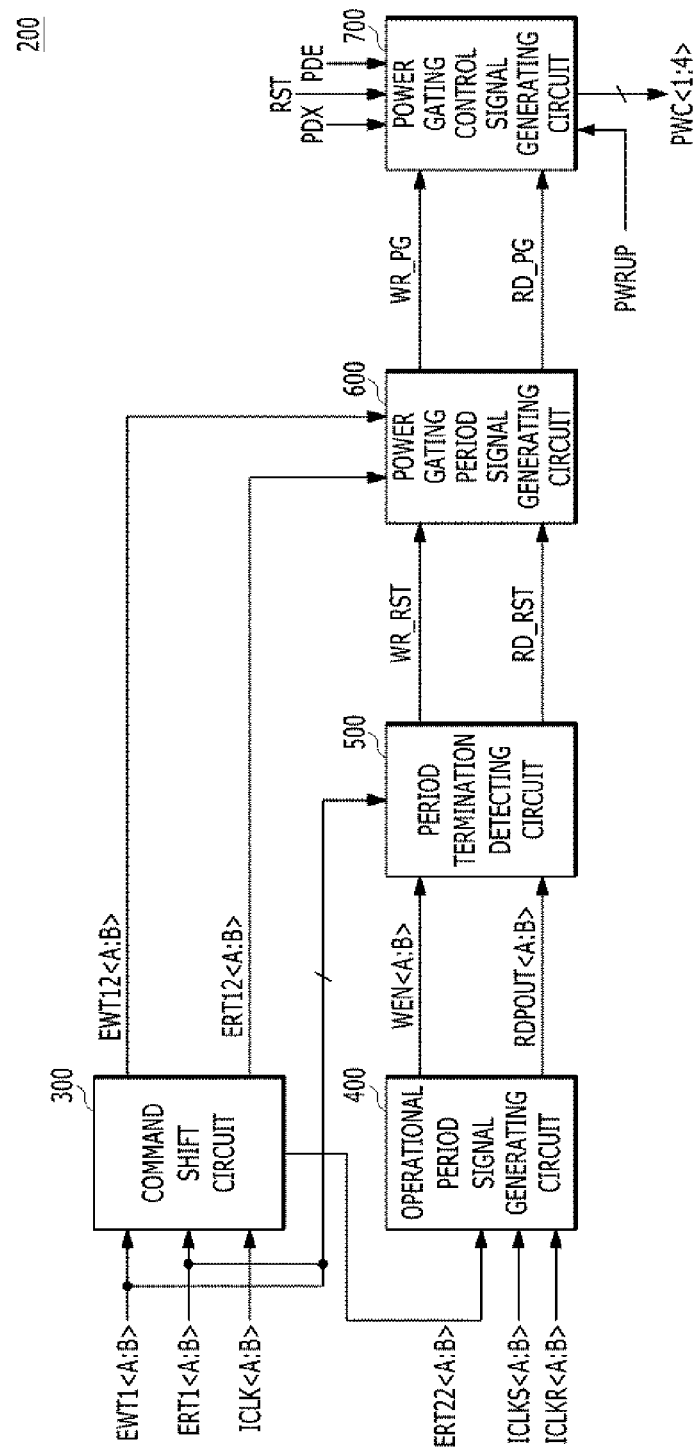
FIG. 3 is a diagram, illustrating a configuration of a power gating control circuit of FIG. 1.

FIG. 3 is a diagram, illustrating a configuration of the power gating control circuit 200 of FIG. 1.

Referring to FIG. 3, the power gating control circuit 200 may generate the first to fourth power gating control signals PWC1 to PWC4 based on the internal clock signals ICLK<A:B>, ICLKS<A:B>, and ICLKR<A:B> that are generated by the clock processing circuit 170 and the command signals EWT1<A:B>, ERT1<A:B>, PDX, and PDE that are generated by the command decoder 141, a reset signal RST, and a power-up signal PWRUP.

The internal clock signal ICLKB may be generated by inverting the internal clock signal ICLKA.

The internal clock signal ICLKA and the internal clock signal ICLKB may have a phase difference of 180° or 'tCK/2'.

The 'tCK' may be a period of a clock signal, for example, a period of the internal clock signal ICLKA.

Among the internal clock signals ICLKS<A:B> and ICLKR<A:B>, the internal clock signal ICLKSA may be generated by dividing the internal clock signals ICLKA with reference to a first edge (e.g., a rising edge or a falling edge) of the internal clock signals ICLKA.

The internal clock signal ICLKRA may be generated by dividing the internal clock signals ICLKA with reference to a second edge (e.g., the falling edge or the rising edge) of the internal clock signals ICLKA.

The internal clock signal ICLKSB may be generated by dividing the internal clock signals ICLKB with reference to a first edge (e.g., a rising edge or a falling edge) of the internal clock signals ICLKB.

The internal clock signal ICLKRB may be generated by dividing the internal clock signals ICLKB with reference to a second edge (e.g., the falling edge or the rising edge) of the internal clock signals ICLKB.

The command signal EWT1A may be generated by decoding a write command based on the internal clock signal ICLKA.

The command signal ERT1A may be generated by decoding a read command based on the internal clock signal ICLKA.

The command signal EWT1B may be generated by decoding a write command based on the internal clock signal ICLKB.

The command signal ERT1B may be generated by decoding a read command based on the internal clock signal ICLKB.

The reset signal RST may be a signal to initialize the power gating. That is, the reset signal RST may be a signal for supplying power to the first to fourth circuit groups 120 to 150. The reset signal RST may be internally generated within the semiconductor apparatus 100 or may be provided from an external device.

The command signals PDE and PDX may control the semiconductor apparatus 100 to enter a power-down mode or to exit from the power-down mode.

The command signal PDE may control the semiconductor apparatus 100 to enter the power-down mode.

The command signal PDX may control the semiconductor apparatus 100 to exit from the power-down mode.

The power-up signal PWRUP may be a signal for defining level stabilization of a power provided to the semiconductor apparatus 100.

The power gating control circuit 200 may include a command shift circuit 300, an operational period signal generating circuit 400, a period termination detecting circuit 500, a power gating period signal generating circuit 600, and a power gating control signal generating circuit 700.

The command shift circuit 300 may generate command shift signals EWT12<A:B>, EWT22<A:B>, ERT12<A:B>, and ERT22<A:B> by shifting the command signals EWT1<A:B> and ERT1<A:B> to have predetermined timing differences based on the internal clock signals ICLK<A:B>.

The operational period signal generating circuit 400 may generate first to fourth operational period signals WEN<A:B> and RDPOUT<A:B> based on some signals EWT22<A:B> and ERT22<A:B> among the internal clock signals ICLKS<A:B> and ICLKR<A:B> and the command shift signals EWT12<A:B>, EWT22<A:B>, ERT12<A:B>, and ERT22<A:B>.

The first operational period signal WENA may define a write operational period of the semiconductor apparatus 100 with reference to the internal clock signal ICLKSA.

The second operational period signal WENS may define a write operational period of the semiconductor apparatus 100 with reference to the internal clock signal ICLKSB.

The third operational period signal RDPOUTA may define a read operational period of the semiconductor apparatus 100 with reference to the internal clock signal ICLKRA.

The fourth operational period signal RDPOUTB may define a read operational period of the semiconductor apparatus 100 with reference to the internal clock signal ICLKRB.

The period termination detecting circuit 500 may generate a write period termination signal WR_RST and a read period termination signal RD_RST based on the command signals EWT1<A:B> and ERT1<A:B> and the first to fourth operational period signals WEN<A:B> and RDPOUT<A:B>.

The power gating period signal generating circuit 600 may generate a first power gating period signal WR_PG and a second power gating period signal RD_PG based on remaining signals EWT12<A:B> and ERT12<A:B> among the command shift signals EWT12<A:B>, EWT22<A:B>, ERT12<A:B>, and ERT22<A:B>, the write period termination signal WR_RST, and the read period termination signal RD_RST.

The power gating control signal generating circuit 700 may generate the first to fourth power gating control signals PWC1 to PWC4 based on the first power gating period signal WR_PG, the second power gating period signal RD_PG, the command signals PDX and PDE, the reset signal RST, and the power-up signal PWRUP.

Figure 4:
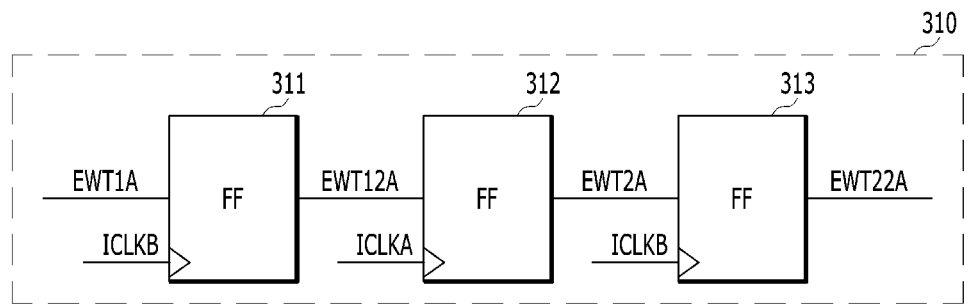
FIG. 4 is a diagram, illustrating a configuration of a command shift circuit of FIG. 3.
Figure 4:
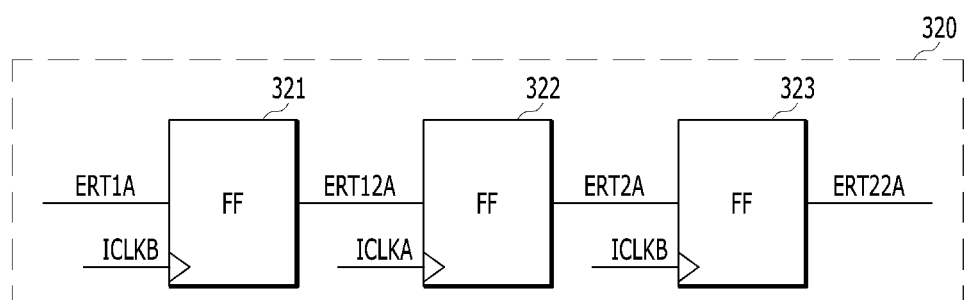
Figure 4:
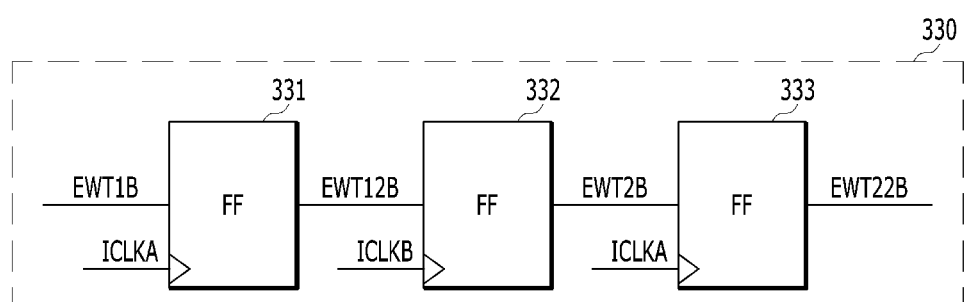
Figure 4:
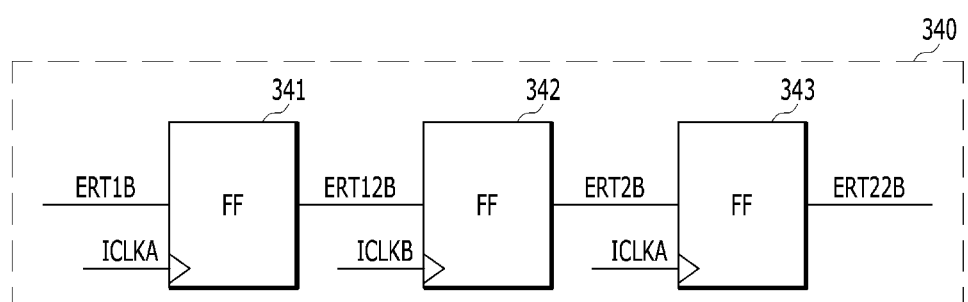

FIG. 4 is a diagram, illustrating a configuration of the command shift circuit 300 of FIG. 3.

The command shift circuit 300 may include a plurality of shift units, that is, first to fourth shift units 310 to 340.

The first shift unit 310 may include first to third flip-flops 311 to 313.

The first flip-flop 311 may generate a command shift signal EWT12A by shifting the command signal EWT1A based on the internal clock signal ICLKB.

The second flip-flop 312 may generate a command shift signal EWT2A by shifting the command shift signal EWT12A based on the internal clock signal ICLKA.

The third flip-flop 313 may generate a command shift signal EWT22A by shifting the command shift signal EWT2A based on the internal clock signal ICLKB.

Since the internal clock signal ICLKA and the internal clock signal ICLKB have a phase difference of 'tCK/2', the command shift signals EWT1A, EWT12A, EWT2A, and EWT22A may also have a phase difference of 'tCK/2' with each other.

The second shift unit 320 may include first to third flip-flops 321 to 323.

The first flip-flop 321 may generate a command shift signal ERT12A by shifting the command signal ERT1A based on the internal clock signal ICLKB.

The second flip-flop 322 may generate a command shift signal ERT2A by shifting the command shift signal ERT12A based on the internal clock signal ICLKA.

The third flip-flop 323 may generate a command shift signal ERT22A by shifting the command shift signal ERT2A based on the internal clock signal ICLKB.

Since the internal clock signal ICLKA and the internal clock signal ICLKB have a phase difference of 'tCK/2', the command shift signals ERT1A, ERT12A, ERT2A, and ERT22A may also have a phase difference of 'tCK/2' with each other.

The third shift unit 330 may include first to third flip-flops 331 to 333.

The first flip-flop 331 may generate a command shift signal EWT12B by shifting the command signal EWT1B based on the internal clock signal ICLKA.

The second flip-flop 332 may generate a command shift signal EWT2B by shifting the command shift signal EWT12B based on the internal clock signal ICLKB.

The third flip-flop 333 may generate a command shift signal EWT22B by shifting the command shift signal EWT2B based on the internal clock signal ICLKA.

Since the internal clock signal ICLKA and the internal clock signal ICLKA have a phase difference of 'tCK/2', the command shift signals EWT1B, EWT12B, EWT2B, and EWT22B may also have a phase difference of 'tCK/2' with each other.

The fourth shift unit 340 may include first to third flip-flops 341 to 343.

The first flip-flop 341 may generate a command shift signal ERT12B by shifting the command signal ERT1B based on the internal clock signal ICLKA.

The second flip-flop 342 may generate a command shift signal ERT2B by shifting the command shift signal ERT12B based on the internal clock signal ICLKB.

The third flip-flop 343 may generate a command shift signal ERT22B by shifting the command shift signal ERT2B based on the internal clock signal ICLKA.

Since the internal clock signal ICLKA and the internal clock signal ICLKB have a phase difference of 'tCK/2', the command shift signals ERT1B, ERT12B, ERT2B, and ERT22B may also have a phase difference of 'tCK/2' with each other.

Figure 5:
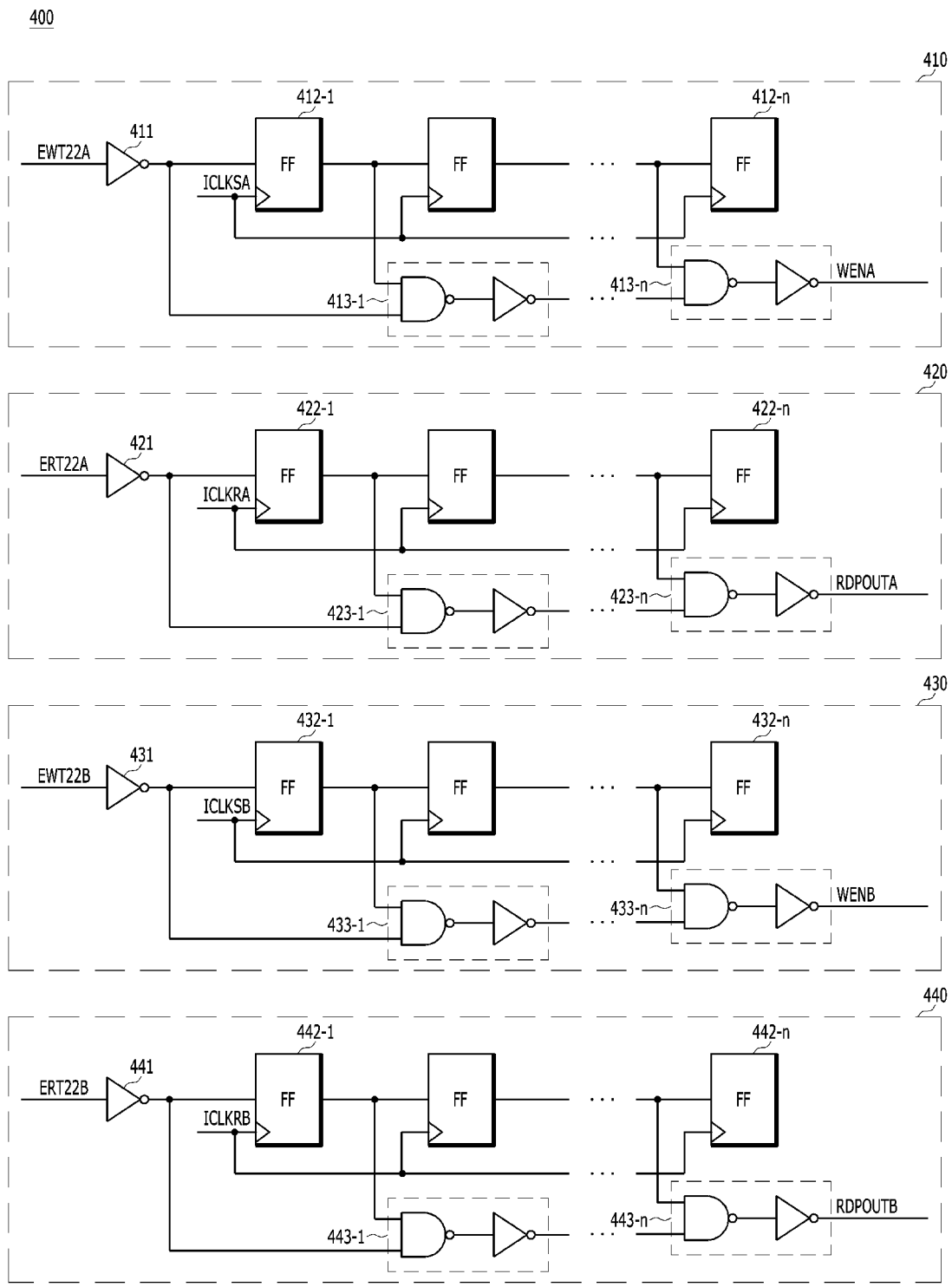
FIG. 5 is a diagram, illustrating a configuration of an operational period signal generating circuit of FIG. 3.

FIG. 5 is a diagram, illustrating a configuration of the operational period signal generating circuit 400 of FIG. 3.

Referring to FIG. 5, the operational period signal generating circuit 400 may include first to fourth operational period signal generating units 410 to 440.

The first operational period signal generating unit 410 may generate the first operational period signal WENA based on the command shift signal EWT22A and the internal clock signal ICLKSA.

The first operational period signal generating unit 410 may include an inverter 411, a plurality of flip-flops 412-1 to 412-*n*, and a plurality of AND operational logics 413-1 to 413-*n*.

The inverter 411 may invert the command shift signal EWT22A and may output the inverted signal.

The plurality of flip-flops 412-1 to 412-*n* may sequentially shift the output of the inverter 411 based on the internal clock signal ICLKSA.

The plurality of AND operational logics 413-1 to 413-*n* may perform AND operations on the outputs of the respective flip-flops 412-1 to 412-*n* with the output of the inverter 411 or outputs of respective AND operational logics of a previous stage.

The first AND operational logic 413-1 among the plurality of AND operational logics 413-1 to 413-*n* may perform an AND operation on the output of the first flip-flop 412-1 with the output of the inverter 411 and may output a result of the AND operation.

Among the plurality of AND operational logics 413-1 to 413-*n*, the remaining AND operational logics 413-2 to 413-*n* other than the first AND operational logic 413-1 may perform AND operations on the outputs of the respective flip-flops 412-2 to 412-*n* with the outputs of respective AND operational logics of a previous stage and may output results of the AND operations.

The last AND operational logic 413-*n* may output the result of the corresponding AND operation as the first operational period signal WENA.

The second operational period signal generating unit 420 may generate the second operational period signal RDPOUTA based on the command shift signal ERT22A and the internal clock signal ICLKRA.

The second operational period signal generating unit 420 may include an inverter 421, a plurality of flip-flops 422-1 to 422-*n*, and a plurality of AND operational logics 423-1 to 423-*n*.

The third operational period signal generating unit 430 may generate the third operational period signal WENB based on the command shift signal EWT22B and the internal clock signal ICLKSB.

The third operational period signal generating unit 430 may include an inverter 431, a plurality of flip-flops 432-1 to 432-*n*, and a plurality of AND operational logics 433-1 to 433-*n*.

The fourth operational period signal generating unit 440 may generate the fourth operational period signal RDPOUTB based on the command shift signal ERT22B and the internal clock signal ICLKRB.

The fourth operational period signal generating unit 440 may include an inverter 441, a plurality of flip-flops 442-1 to 442-*n*, and a plurality of AND operational logics 443-1 to 443-*n*.

The configuration of the internal circuits, the coupling relationships between the internal circuits, and the operations of the respective operational period signal generating units 420 to 440 may be the same as the first operational period signal generating unit 410, and thus, the description thereof will be omitted.

Figure 6:
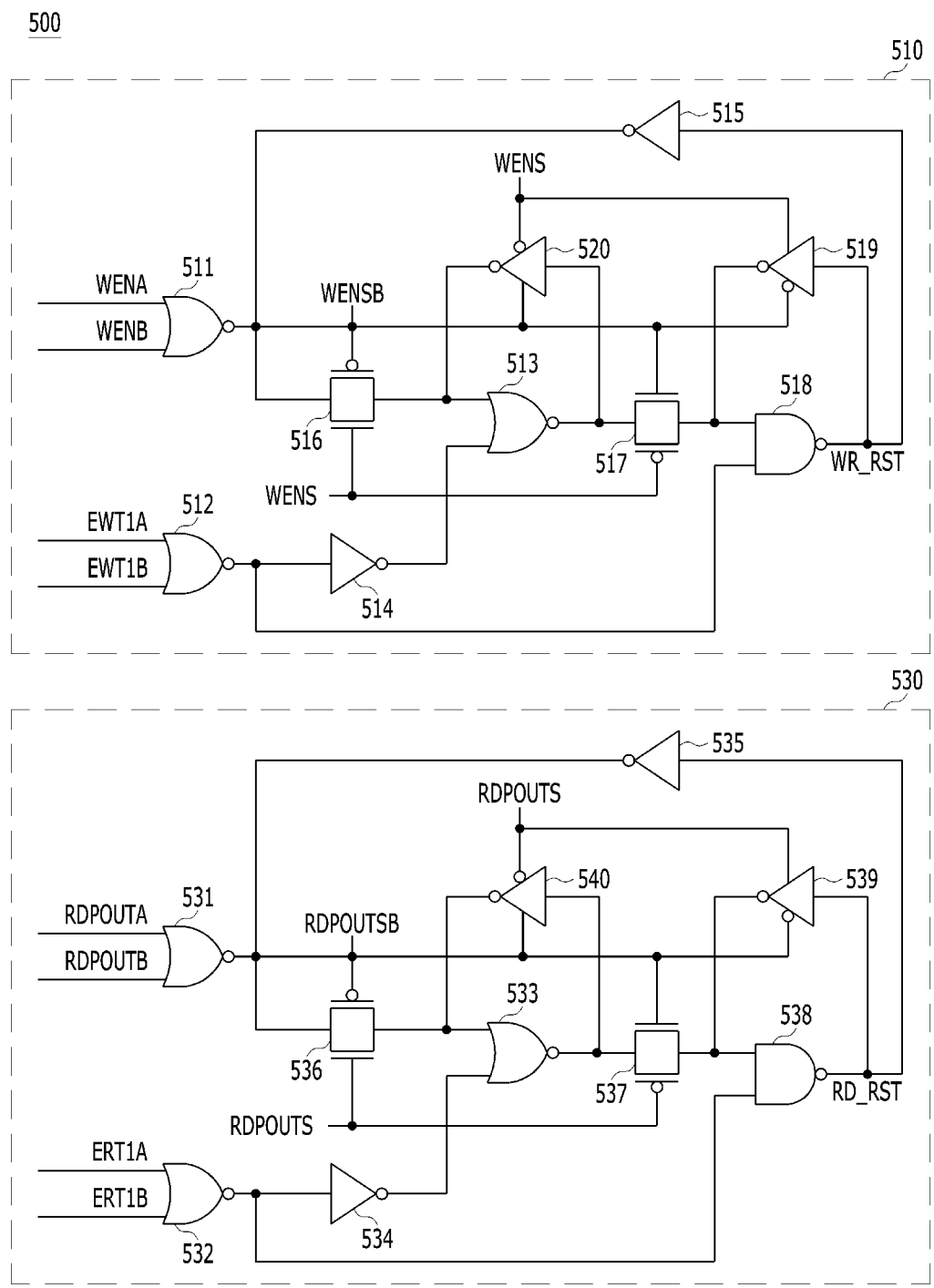
FIG. 6 is a diagram, illustrating a configuration of a period termination detecting circuit of FIG. 3.

FIG. 6 is a diagram, illustrating a configuration of the period termination detecting circuit 500 of FIG. 3.

Referring to FIG. 6, the period termination detecting circuit 500 may include a write period termination signal generating circuit 510 and a read period termination signal generating circuit 530.

The write period termination signal generating circuit 510 may generate the write period termination signal WR_RST based on the command signals EWT1<A:B>, the first operational period signal WENA, and the third operational period signal WENB.

The write period termination signal generating circuit 510 may include first to third NOR gates 511 to 513, first and second inverters 514 and 515, first and second pass gates 516 and 517, a NAND gate 518, and first and second tri-state inverters 519 and 520.

The first NOR gate 511 may generate an output signal WENSB by performing a NOR operation on the first operational period signal WENA with the third operational period signal WENB.

The second NOR gate 512 may perform a NOR operation on the command signals EWT1<A:B> and may output a result of the NOR operation.

The first inverter 514 may invert the output signal of the second NOR gate 512 and may output the inverted signal.

The second inverter 515 may invert the write period termination signal WR_RST and may output the inverted signal.

The first pass gate 516 may pass the output signal of the second inverter 515 based on the output signal WENSB of the first NOR gate 511 and an inverted signal WENS of the output signal WENSB of the first NOR gate 511.

The third NOR gate 513 may perform a NOR operation on the output signal of the first pass gate 516 with the output signal of the first inverter 514 and may output a result of the NOR operation.

The second pass gate 517 may pass the output signal of the third NOR gate 513 based on the output signal WENSB of the first NOR gate 511 and the inverted signal WENS of the output signal WENSB of the first NOR gate 511.

The NAND gate 518 may perform a NAND operation on the output signal of the second pass gate 517 with the output signal of the second NOR gate 512 and may output, as the write period termination signal WR_RST, a result of the NAND operation.

The first tri-state inverter 519 may latch the write period termination signal WR_RST based on the output signal WENSB of the first NOR gate 511 and the inverted signal WENS of the output signal WENSB of the first NOR gate 511.

The second tri-state inverter 520 may latch the output signal of the third NOR gate 513 based on the output signal WENSB of the first NOR gate 511 and the inverted signal WENS of the output signal WENSB of the first NOR gate 511.

The read period termination signal generating circuit 530 may generate the read period termination signal RD_RST based on the command signals ERT1<A:B>, the second operational period signal RDPOUTA, and the fourth operational period signal RDPOUTB.

The read period termination signal generating circuit 530 may include first to third NOR gates 531 to 533, first and second inverters 534 and 535, first and second pass gates 536 and 537, a NAND gate 538, and first and second tri-state inverters 539 and 540.

The first NOR gate 531 may generate an output signal RDPOUTSB by performing a NOR operation on the second operational period signal RDPOUTA with the fourth operational period signal RDPOUTB.

The second NOR gate 532 may perform a NOR operation on the command signals ERT1<A:B> and may output a result of the NOR operation.

The first inverter 534 may invert the output signal of the second NOR gate 532 and may output the inverted signal.

The second inverter 535 may invert the read period termination signal RD_RST and may output the inverted signal.

The first pass gate 536 may pass the output signal of the second inverter 535 based on the output signal RDPOUTSB of the first NOR gate 531 and an inverted signal RDPOUTS of the output signal RDPOUTSB of the first NOR gate 531.

The third NOR gate 533 may perform a NOR operation on the output signal of the first pass gate 536 with the output signal of the first inverter 534 and may output a result of the NOR operation.

The second pass gate 537 may pass the output signal of the third NOR gate 533 based on the output signal RDPOUTSB of the first NOR gate 531 and the inverted signal RDPOUTS of the output signal RDPOUTSB of the first NOR gate 531.

The NAND gate 538 may perform a NAND operation on the output signal of the second pass gate 537 with the output signal of the second NOR gate 532 and may output, as the read period termination signal RD_RST, a result of the NAND operation.

The first tri-state inverter 539 may latch the read period termination signal RD_RST based on the output signal RDPOUTSB of the first NOR gate 531 and the inverted signal RDPOUTS of the output signal RDPOUTSB of the first NOR gate 531.

The second tri-state inverter 540 may latch the output signal of the third NOR gate 533 based on the output signal RDPOUTSB of the first NOR gate 531 and the inverted signal RDPOUTS of the output signal RDPOUTSB of the first NOR gate 531.

Figure 7:
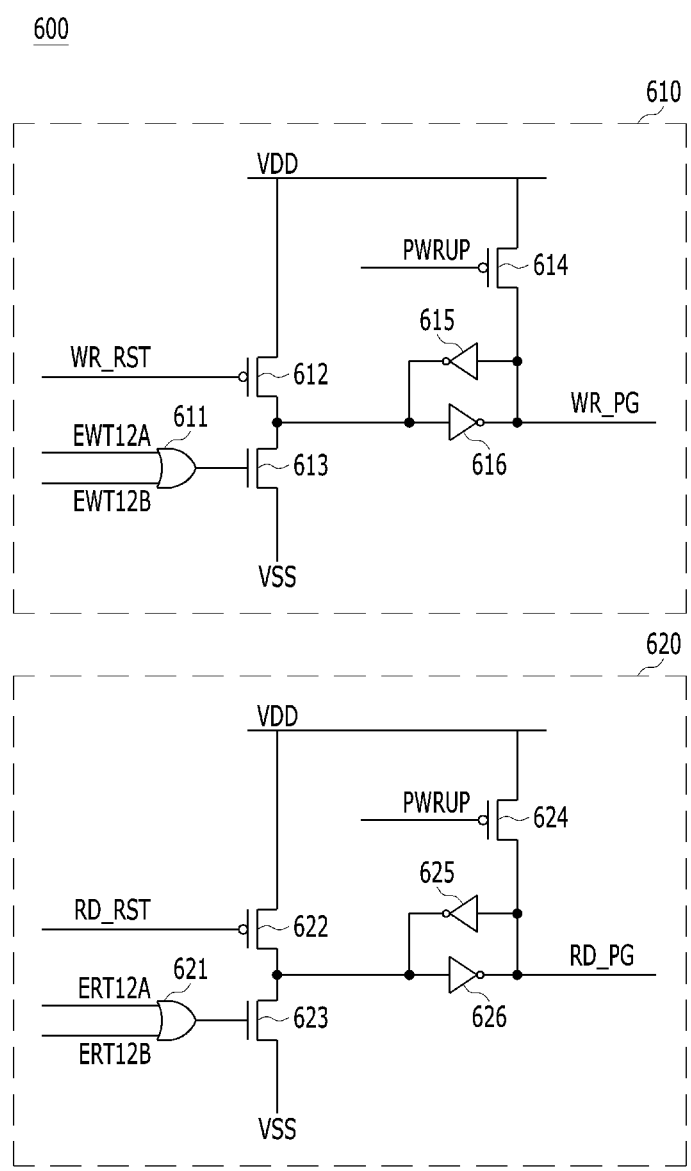
FIG. 7 is a diagram, illustrating a configuration of a power gating period signal generating circuit of FIG. 3.

FIG. 7 is a diagram, illustrating a configuration of the power gating period signal generating circuit 600 of FIG. 3.

Referring to FIG. 7, the power gating period signal generating circuit 600 may include a first power gating period signal generating unit 610 and a second power gating period signal generating unit 620.

The first power gating period signal generating unit 610 may generate the first power gating period signal WR_PG based on the command shift signals EWT12<A:B>, the write period termination signal WR_RST and the power-up signal PWRUP.

The first power gating period signal generating unit 610 may include an OR gate 611, first to third transistors 612 to 614, and first and second inverters 615 and 616.

The OR gate 611 may perform an OR operation on the command shift signals EWT12<A:B> and may output a result of the OR operation.

The first transistor 612 may receive the power voltage VDD at its source and may receive the write period termination signal WR_RST at its gate.

The second transistor 613 may be coupled to a drain of the first transistor 612 at its drain, may receive the ground voltage VSS at its source, and may receive the output of the OR gate 611 at its gate.

The third transistor 614 may receive the power voltage VDD at its source, may receive the power-up signal PWRUP at its gate, and may be coupled to an output node of the first power gating period signal WR_PG at its drain.

The first and second inverters 615 and 616 may invert the logic level of a node that is commonly coupled to the drains of the first transistor 612 and the second transistor 613, may output the inverted logic level as the first power gating period signal WR_PG, and may latch the first power gating period signal WR_PG.

The second power gating period signal generating unit 620 may generate the second power gating period signal RD_PG based on the command shift signals ERT12<A:B>, the read period termination signal RD_RST, and the power-up signal PWRUP.

The second power gating period signal generating unit 620 may include an OR gate 621, first to third transistors 622 to 624, and first and second inverters 625 and 626.

The OR gate 621 may perform an OR operation on the command shift signals ERT12<A:B> and may output a result of the OR operation.

The first transistor 622 may receive the power voltage VDD at its source and may receive the read period termination signal RD_RST at its gate.

The second transistor 623 may be coupled to a drain of the first transistor 622 at its drain, may receive the ground voltage VSS at its source, and may receive the output of the OR gate 621 at its gate.

The third transistor 624 may receive the power voltage VDD at its source, may receive the power-up signal PWRUP at its gate, and may be coupled to an output node of the second power gating period signal RD_PG at its drain.

The first and second inverters 625 and 626 may invert the logic level of a node that is commonly coupled to the drains of the first transistor 622 and the second transistor 623, may output the inverted logic level as the second power gating period signal RD_PG, and may latch the second power gating period signal RD_PG.

Figure 8:
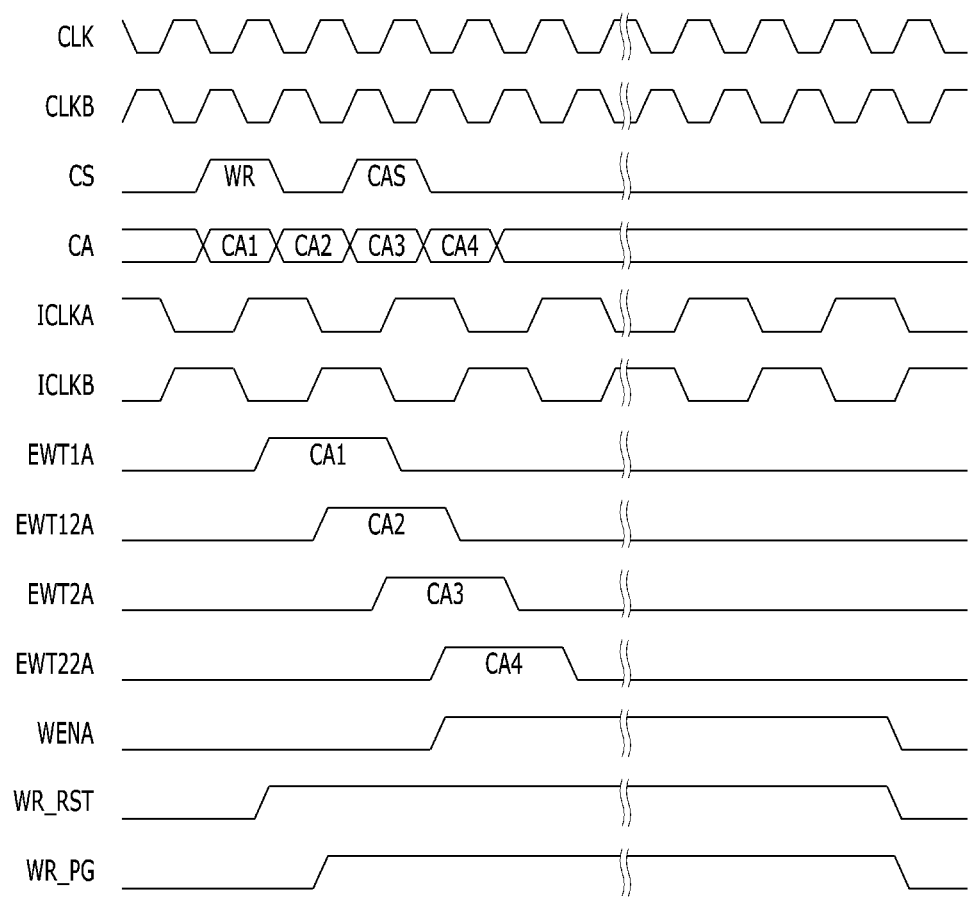
FIGS. 8 and 9 are diagrams, illustrating operations of a period termination detecting circuit and a power gating period signal generating circuit in accordance with an embodiment.
Figure 9:
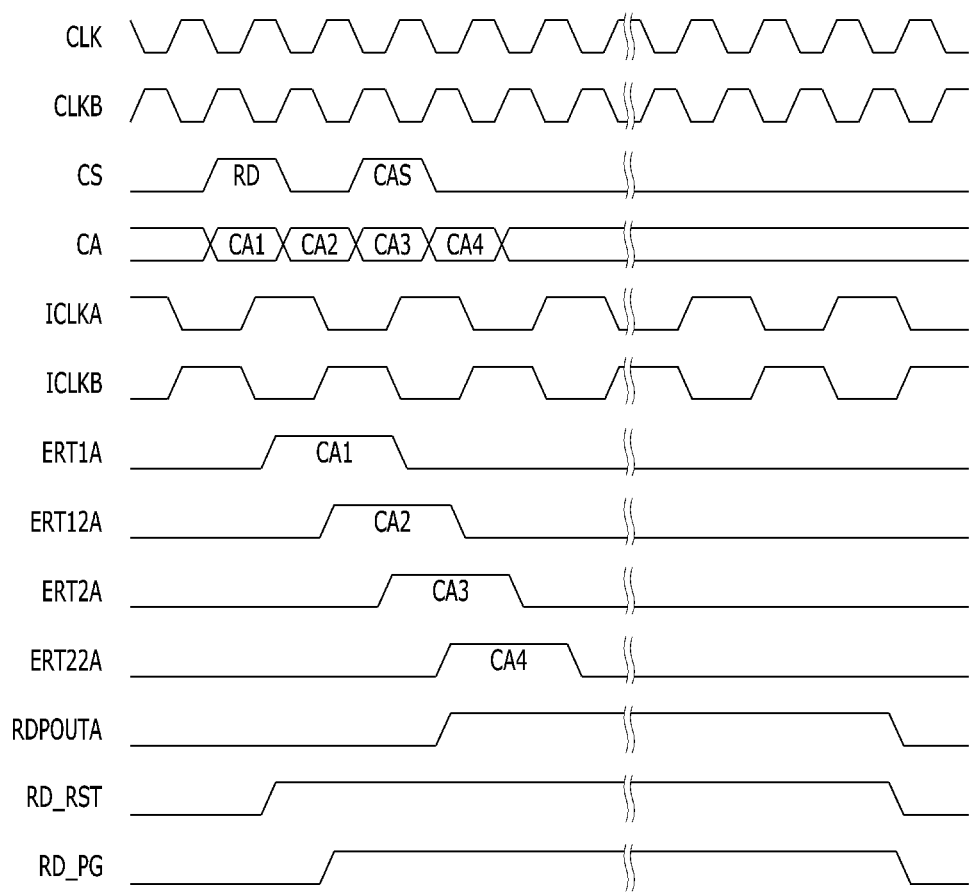

FIGS. 8 and 9 are diagrams, illustrating operations of the period termination detecting circuit 500 and the power gating period signal generating circuit 600 in accordance with an embodiment.

Hereinafter, described with reference to FIGS. 6 to 9 will be the operations of the period termination detecting circuit 500 and the power gating period signal generating circuit 600 in accordance with an embodiment.

Referring to FIGS. 6 and 8 in case of a write operation, input may be commands CA1 to CA4, which are defined by the command/address signal CA and the chip selection signal CS.

As the command signal EWT1A transitions to a high level based on a write command WR, the second NOR gate 512 may output the signal of a low level and the first inverter 514 may output the signal of a high level.

As the second NOR gate 512 outputs the signal of a low level, the NAND gate 518 may output the write period termination signal WR_RST of a high level.

Since the write period termination signal WR_RST is at a high level, the level of the output node of the first NOR gate 511 (i.e., the output signal WENSB) becomes a low level, and thus, the first pass gate 516 and the first tri-state inverter 519 may become turned on and the second pass gate 517 and the second tri-state inverter 520 may become turned off.

The turned-on first tri-state inverter 519 may latch the output of the NAND gate 518, and thus, the write period termination signal WR_RST may maintain a high level.

As both the first operational period signal WENA and the second operational period signal WENB transition to a low level, the output signal WENSB of the first NOR gate 511 may transition to a high level.

Since the output signal WENSB of the first NOR gate 511 is at a high level, the first pass gate 516 and the first tri-state inverter 519 may become turned off and the second pass gate 517 and the second tri-state inverter 520 may become turned on.

As all of the command signals EWT1<A:B> transition to a low level, the second NOR gate 512 may output the signal of a high level and the first inverter 514 may output the signal of a low level.

Since any one between the inputs to the third NOR gate 513 maintains a low level during the turn-on of the second tri-state inverter 520, the third NOR gate 513 may output the signal of a high level as the first inverter 514 outputs the signal of a low level.

Since the second NOR gate 512 outputs the signal of a high level and the third NOR gate 513 outputs the signal of a high level through the turned-on second pass gate 517, the NAND gate 518 may change the write period termination signal WR_RST to a low level.

Referring to FIGS. 7 and 8, as the command signal EWT1A transitions to a high level, the first power gating period signal WR_PG may transition to a high level.

After all of the command signals EWT1<A:B> transition to a low level, the first power gating period signal WR_PG may transition to a low level as the write period termination signal WR_RST transitions to a low level.

Referring to FIGS. 6 and 9, in the case of a write operation, input may be commands CA1 to CA4, which are defined by the command/address signal CA and the chip selection signal CS.

As the command signal ERT1A transitions to a high level based on a read command RD, the second NOR gate 532 may output the signal of a low level and the first inverter 534 may output the signal of a high level.

As the second NOR gate 532 outputs the signal of a low level, the NAND gate 538 may output the read period termination signal RD_RST of a high level.

Since the read period termination signal RD_RST is at a high level, the level of the output node of the first NOR gate 531 (i.e., the output signal RDPOUTSB) becomes a low level and thus the first pass gate 536 and the first tri-state inverter 539 may become turned on and the second pass gate 537 and the second tri-state inverter 540 may become turned off.

The turned-on first tri-state inverter 539 may latch the output of the NAND gate 538 and thus the read period termination signal RD_RST may maintain a high level.

As both the third operational period signal RDPOUTA and the fourth operational period signal RDPOUTB transition to a low level, the output signal RDPOUTSB of the first NOR gate 531 may transition to a high level.

Since the output signal RDPOUTSB of the first NOR gate 531 is at a high level, the first pass gate 536 and the first tri-state inverter 539 may become turned off and the second pass gate 537 and the second tri-state inverter 540 may become turned on.

As all of the command signals ERT1<A:B> transition to a low level, the second NOR gate 532 may output the signal of a high level and the first inverter 534 may output the signal of a low level.

Since any one between the inputs to the third NOR gate 533 maintains a low level during the turn-on of the second tri-state inverter 540, the third NOR gate 533 may output the signal of a high level as the first inverter 534 outputs the signal of a low level.

Since the second NOR gate 532 outputs the signal of a high level and the third NOR gate 533 outputs the signal of a high level through the turned-on second pass gate 537, the NAND gate 538 may change the read period termination signal RD_RST to a low level.

Referring to FIGS. 7 and 9, as the command signal ERT1A transitions to a high level, the second power gating period signal RD_PG may transition to a high level.

After all of the command signals ERT1<A:B> transition to a low level, the second power gating period signal RD_PG may transition to a low level as the read period termination signal RD_RST transitions to a low level.

Figure 10:
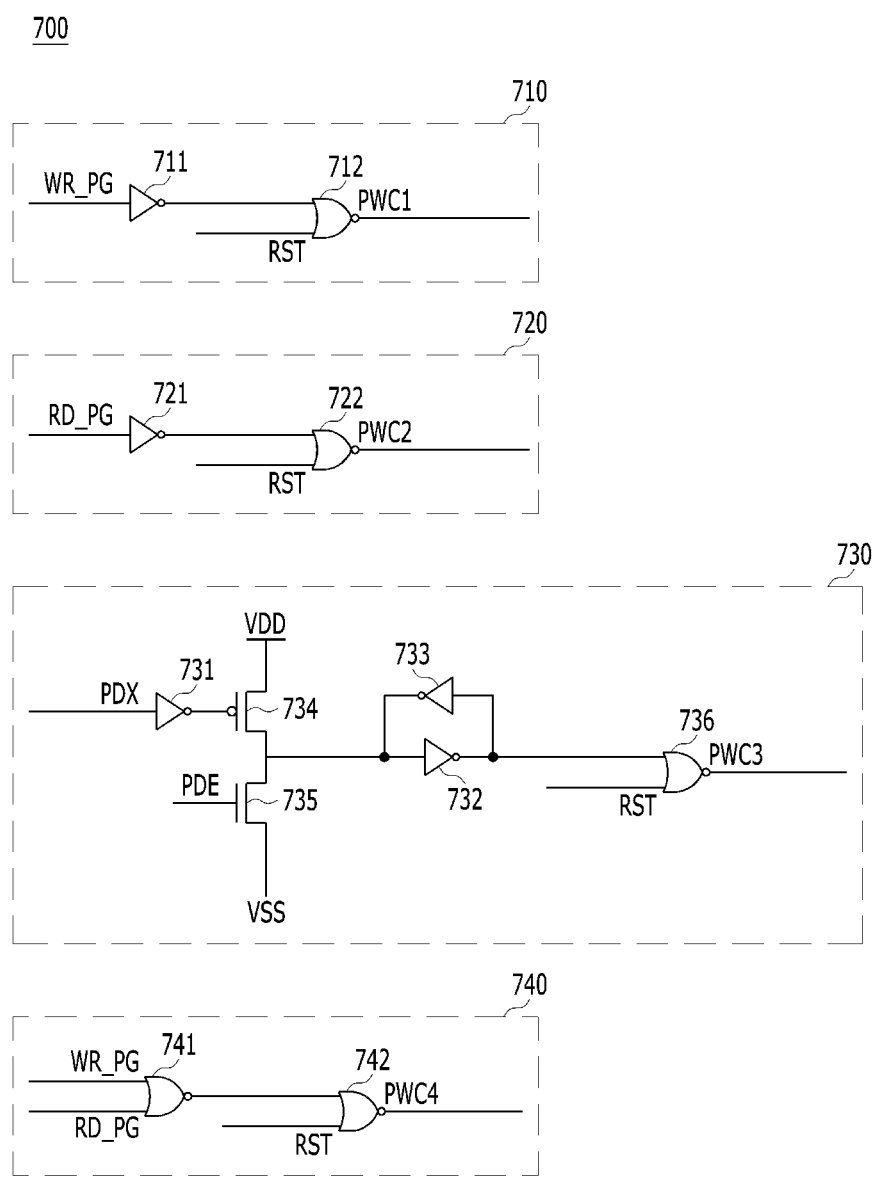
FIG. 10 is a diagram, illustrating a configuration of a power gating control signal generating circuit of FIG. 3.

FIG. 10 is a diagram, illustrating a configuration of the power gating control signal generating circuit 700 of FIG. 3.

Referring to FIG. 10, the power gating control signal generating circuit 700 may include first to fourth power gating control signal generating units 710 to 740.

The first power gating control signal generating unit 710 may generate the first power gating control signal PWC1 based on the first power gating period signal WR_PG and the reset signal RST.

The first power gating control signal generating unit 710 may include an inverter 711 and a NOR gate 712.

The inverter 711 may invert the first power gating period signal WR_PG and may output the inverted signal.

The NOR gate 712 may perform a NOR operation on the output of the inverter 711 with the reset signal RST and may output, as the first power gating control signal PWC1, a result of the NOR operation.

As the reset signal RST transitions to a high level during an initial operation of the semiconductor apparatus 100 or under a particular situation of the semiconductor apparatus 100, the first power gating control signal PWC1 may be initialized to a low level.

As the reset signal RST transitions to a low level and the first power gating period signal WR_PG maintains a high level, the first power gating control signal PWC1 may maintain a high level.

The second power gating control signal generating unit 720 may generate the second power gating control signal PWC2 based on the second power gating period signal RD_PG and the reset signal RST.

The second power gating control signal generating unit 720 may include an Inverter 721 and a NOR gate 722.

The inverter 721 may invert the second power gating period signal RD_PG and may output the inverted signal.

The NOR gate 722 may perform a NOR operation on the output of the inverter 721 with the reset signal RST and may output, as the second power gating control signal PWC2, a result of the NOR operation.

As the reset signal RST transitions to a high level during an initial operation of the semiconductor apparatus 100 or under a particular situation of the semiconductor apparatus 100, the second power gating control signal PWC2 may be initialized to a low level.

As the reset signal RST transitions to a low level and the second power gating period signal RD_PG maintains a high level, the second power gating control signal PWC2 may maintain a high level.

The third power gating control signal generating unit 730 may generate the third power gating control signal PWC3 based on the command signals PDE and PDX and the reset signal RST.

The third power gating control signal generating unit 730 may include first to third inverters 731 to 733, first and second transistors 734 and 735 and a NOR gate 736.

The first inverter 731 may invert the command signal PDX and may output the inverted signal.

The first transistor 734 may receive the power voltage VDD at its source and may receive the output of the first inverter 731 at its gate.

The second transistor 735 may receive the ground voltage VSS at its source, may receive the command signal PDE at its gate and may be coupled to a drain of the first transistor 734 at its drain.

The second inverter 732 may invert a logic level of a node commonly coupled to the drains of the first transistor 734 and the second transistor 735 and may output the inverted signal.

The third inverter 733 may feed the output of the second Inverter 732 back to an input of the second inverter 732 to latch the output level of the second inverter 732.

The NOR gate 736 may perform a NOR operation on the output of the second inverter 732 with the reset signal RST and may output, as the third power gating control signal PWC3, a result of the NOR operation.

As the command signal PDE transitions to a high level, the third power gating control signal PWC3 may transition to a low level and may maintain a low level.

As the command signal PDX transitions to a high level, the third power gating control signal PWC3 may transition to a high level and may maintain a high level.

The fourth power gating control signal generating unit 740 may generate the fourth power gating control signal PWC4 based on the first power gating period signal WR_PG, the second power gating period signal RD_PG and the reset signal RST.

The fourth power gating control signal generating unit 740 may include first and second NOR gates 741 and 742.

The first NOR gate 741 may perform a NOR operation on the first power gating period signal WR_PG with the second power gating period signal RD_PG and may output a result of the NOR operation.

The second NOR gate 742 may perform a NOR operation on the output of the first NOR gate 741 with the reset signal RST and may output, as the fourth power gating control signal PWC4, a result of the NOR operation.

As the reset signal RST transitions to a high level, the fourth power gating control signal PWC4 may be initialized to a low level.

As the reset signal RST transitions to a low level and both the first power gating period signal WR_PG and the second power gating period signal RD_PG maintain a high level, the fourth power gating control signal PWC4 may maintain a high level.

Figure 11:
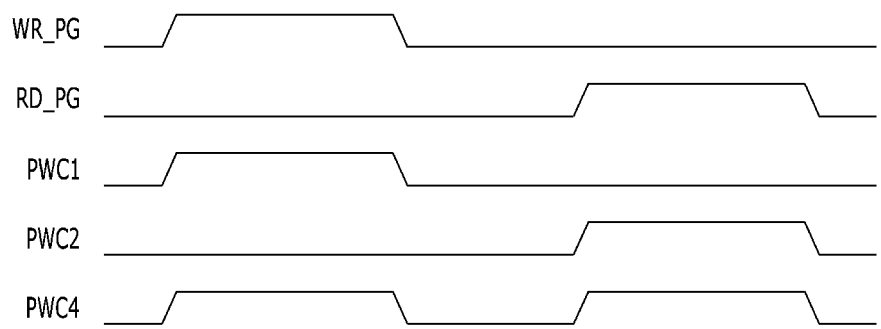
FIGS. 11 and 12 are diagrams, illustrating an operation of a power gating control signal generating circuit in accordance with an embodiment.
Figure 12:
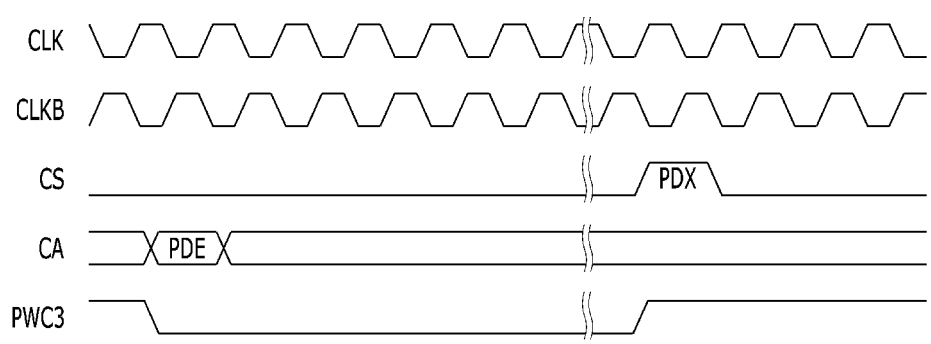

FIGS. 11 and 12 are diagrams, illustrating an operation of the power gating control signal generating circuit 700 in accordance with an embodiment.

Referring to FIGS. 10 and 11, the first power gating control signal PWC1 may maintain a high level while the first power gating period signal WR_PG maintains a high level, that is, during the write operational period of the semiconductor apparatus 100.

While the first power gating control signal PWC1 maintains a high level, that is, during the write operational period of the semiconductor apparatus 100, the power may be supplied to the first circuit group 120.

The second power gating control signal PWC2 may maintain a high level while the second power gating period signal RD_PG maintains a high level, that is, during the read operational period of the semiconductor apparatus 100.

While the second power gating control signal PWC2 maintains a high level, that is, during the read operational period of the semiconductor apparatus 100, the power may be supplied to the second circuit group 130.

The fourth power gating control signal PWC4 may maintain a high level while the first power gating period signal WR_PG maintains a high level and the second power gating period signal RD_PG maintains a high level, that is, during the write operational period and the read operational period of the semiconductor apparatus 100.

While the fourth power gating control signal PWC4 maintains a high level, that is, during the write operational period and the read operational period of the semiconductor apparatus 100, the power may be supplied to the fourth circuit group 150.

Each of the first power gating control signal PWC1, the second power gating control signal PWC2 and the fourth power gating control signal PWC4 may maintain a high level during a predetermined period regardless of the power-down mode of the semiconductor apparatus 100.

While each of the first power gating control signal PWC1, the second power gating control signal PWC2 and the fourth power gating control signal PWC4 maintains a high level, the power may be supplied to a corresponding one among the first, second and fourth circuit group 120, 130 and 150.

While each of the first power gating control signal PWC1, the second power gating control signal PWC2 and the fourth power gating control signal PWC4 maintains a low level, the power supply to a corresponding one among the first, second and fourth circuit group 120, 130 and 150 may be interrupted.

Referring to FIGS. 10 and 12, the third power gating control signal PWC3 may transition to a low level as the command signal PDE transitions to a high level, the command signal PDE defining the entry of the semiconductor apparatus 100 into the power-down mode.

After that, the third power gating control signal PWC3 may transition to a high level as the command signal PDX transitions to a high level due to a toggle of the chip selection signal CS, the command signal PDX defining the exit of the semiconductor apparatus 100 from the power-down mode.

While the third power gating control signal PWC3 maintains a high level, the power may be supplied to the third circuit group 140.

While the third power gating control signal PWC3 maintains a low level, that is, during the power-down mode of the semiconductor apparatus 100, the power supply to the third circuit group 140 may be interrupted.

While certain embodiments have been described above, it will be understood to those skilled in the art that the embodiments described are by way of example only. Accordingly, the power gating control circuit and semiconductor apparatus with the power gating control circuit should not be limited based on the described embodiments. Rather, the power gating control circuit and semiconductor apparatus with the power gating control circuit described herein should only be limited in light of the claims that follow when taken in conjunction with the above description and accompanying drawings.

What is claimed is:

1. A semiconductor apparatus comprising:
an operational period signal generating circuit configured to generate a plurality of operational period signals based on internal clock signals and one or more of command shift signals;
a period termination detecting circuit configured to generate a write period termination signal and a read period termination signal based on the command signals and the plurality of operational period signals;
a power gating period signal generating circuit configured to generate a first power gating period signal and a second power gating period signal based on the write period termination signal, the read period termination signal, and remaining command shift signals other than the one or more of command shift signals; and
a power gating control signal generating circuit configured to generate a plurality of power gating control signals based on the first power gating period signal, the second power gating period signal, and other signals to control entry into and exit from a power-down mode of a semiconductor apparatus.

2. The semiconductor apparatus of claim 1,
further comprising a command shift circuit configured to generate the command shift signals by shifting command signals based on the internal clock signals,
wherein the command shift signals have predetermined timing differences.

3. The semiconductor apparatus of claim 2, wherein the command shift circuit includes a plurality of shift units, each configured to generate a corresponding command shift signal among the command shift signals by sequentially shifting the corresponding command shift signal among the command signals based on a first internal clock signal and a second internal clock signal, the second internal clock signal with an opposite phase compared to the first internal clock signal, among the internal clock signals.

4. The semiconductor apparatus of claim 1, wherein each of the plurality of operational period signals defines a write operational period or a read operational period of the semiconductor apparatus with reference to a corresponding internal clock signal among the internal clock signals.

5. The semiconductor apparatus of claim 1,
wherein the operational period signal generating circuit includes a plurality of operational period signal generating units, and
wherein each of the operational period signal generating units includes:
a plurality of flip-flops configured to shift a corresponding command shift signal among the command shift signals based on a corresponding internal clock signal among the internal clock signals; and
a plurality of AND operational logics configured to generate a corresponding operational period signal among the plurality of operational period signals by performing AND operations on outputs of the respective flip-flops with outputs of respective AND operational logics of a previous stage.

6. The semiconductor apparatus of claim 1, wherein the period termination detecting circuit includes:
a write period termination signal generating circuit configured to generate the write period termination signal based on one or more of the command signals and one or more of the plurality of operational period signals; and
a read period termination signal generating circuit configured to generate the read period termination signal based on remaining command signals other than the one or more of command shift signals and remaining operational period signals other than the one or more of the plurality of operational period signals.

7. The semiconductor apparatus of claim 1, wherein the power gating period signal generating circuit includes:
a first power gating period signal generating unit configured to generate the first power gating period signal based on the write period termination signal, a power-up signal, and one or more of the command shift signals; and
a second power gating period signal generating unit configured to generate the second power gating period signal based on the read period termination signal, the power-up signal, and remaining command shift signals other than the one or more of command shift signals.

8. The semiconductor apparatus of claim 1, wherein the power gating control signal generating circuit includes:
a first power gating control signal generating unit configured to generate a first power gating control signal among the plurality of power gating control signals based on the first power gating period signal and a reset signal;

a second power gating control signal generating unit configured to generate a second power gating control signal among the plurality of power gating control signals based on the second power gating period signal and the reset signal;

a third power gating control signal generating unit configured to generate a third power gating control signal among the plurality of power gating control signals based on the signals to control entry into and exit from the power-down mode of the semiconductor apparatus and the reset signal;

a fourth power gating control signal generating unit configured to generate a fourth power gating control signal among the plurality of power gating control signals based on the first power gating period signal, the second power gating period signal, and the reset signal.

9. A semiconductor apparatus comprising:

a plurality of circuit groups including a first circuit group to be activated during a data write operation of the semiconductor apparatus and a second circuit group to be activated during a data read operation of the semiconductor apparatus; and a power gating control circuit configured to generate a plurality of power gating control signals to cut off a power supply provided to the first circuit group during the data read operation and cut off the power supply provided to the second circuit group during the data write operation.

* * * * *